US010320961B2

(12) United States Patent
Wei et al.

(10) Patent No.: US 10,320,961 B2
(45) Date of Patent: Jun. 11, 2019

(54) BRACKET ASSEMBLY FOR FUNCTIONAL COMPONENT FOR MOBILE TERMINAL

(71) Applicant: GUANGDONG OPPO MOBILE TELECOMMUNICATIONS CORP., LTD., Dongguan, Guangdon (CN)

(72) Inventors: Yi Wei, Dongguan (CN); Yong Li, Dongguan (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 15/722,628

(22) Filed: Oct. 2, 2017

(65) Prior Publication Data
US 2018/0176346 A1 Jun. 21, 2018

(30) Foreign Application Priority Data

Dec. 20, 2016 (CN) .......................... 2016 1 1189501

(51) Int. Cl.
*H04M 1/02* (2006.01)
*H04B 1/3888* (2015.01)
*G06F 1/16* (2006.01)
*H04M 1/03* (2006.01)
*H05K 1/02* (2006.01)

(52) U.S. Cl.
CPC .......... *H04M 1/026* (2013.01); *G06F 1/1658* (2013.01); *H04B 1/3888* (2013.01); *H04M 1/0249* (2013.01); *H04M 1/0264* (2013.01); *H04M 1/03* (2013.01); *H05K 1/0215* (2013.01)

(58) Field of Classification Search
CPC .. H04M 1/026; H04M 1/0249; H04B 1/3888; G06F 1/1658
USPC ..................................... 361/679.55
See application file for complete search history.

(56) References Cited

U.S. PATENT DOCUMENTS

| 7,692,927 B2 | 4/2010 | Jin et al. | |
| 2010/0014016 A1* | 1/2010 | Chen ................... | G02F 1/13452 349/58 |
| 2013/0115816 A1* | 5/2013 | Lin ..................... | H01R 12/7076 439/607.31 |
| 2013/0170159 A1* | 7/2013 | Jiang ................... | H04M 1/0249 361/753 |

(Continued)

FOREIGN PATENT DOCUMENTS

| CN | 204332960 U | 5/2015 |
| CN | 105187697 A | 12/2015 |

(Continued)

*Primary Examiner* — Rockshana D Chowdhury
(74) *Attorney, Agent, or Firm* — Ladas & Parry LLP

(57) ABSTRACT

A bracket assembly, a functional component, and a mobile terminal are provided. The bracket assembly configured to fix an electronic component and conduct a ground electrode includes a metal support and a plurality of conductive members. The metal support includes a mounting part and a carrier part surrounding the mounting part. The mounting part is configured to fix the electronic component. The carrier part includes a plurality of ground parts arranged circumferentially about the mounting part at intervals. Each of the conductive members is connected to a corresponding one of the ground parts and configured to conduct a corresponding one of the ground parts and the ground electrode.

17 Claims, 7 Drawing Sheets

(56) References Cited

U.S. PATENT DOCUMENTS

| | | | |
|---|---|---|---|
| 2014/0063821 A1* | 3/2014 | Hegde | H04M 1/0264 |
| | | | 362/382 |
| 2014/0111684 A1* | 4/2014 | Corbin | H01Q 1/243 |
| | | | 348/374 |
| 2014/0232900 A1* | 8/2014 | Wernersson | H04N 5/2251 |
| | | | 348/223.1 |
| 2017/0238410 A1 | 8/2017 | Li et al. | |

FOREIGN PATENT DOCUMENTS

| | | |
|---|---|---|
| CN | 204948203 U | 1/2016 |
| CN | 205510596 U | 8/2016 |
| EP | 2031952 A1 | 3/2009 |
| WO | 2014178260 A1 | 6/2014 |
| WO | 2014178260 A1 | 11/2014 |
| WO | 2016058182 A1 | 4/2016 |

* cited by examiner

BRACKET ASSEMBLY FOR FUNCTIONAL COMPONENT FOR MOBILE TERMINAL

CROSS REFERENCE TO RELATED APPLICATION

This application claims priority to Chinese Application No. 201611189501.4 filed Dec. 20, 2016. The entire disclosure of the above application is incorporated herein by reference in its entirety.

BACKGROUND

Field

The present disclosure relates to the field of electronic equipment, and particularly to a bracket assembly for a functional component for a mobile terminal.

Background

Widespread and growing use of smart phones increases the need for a support to stabilize electronic components inside a mobile phone. In consideration of rigidity, size, and installation requirements of the support, a metal support is usually used to stabilize the electronic component. However, because metal is conductive, the metal support easily interferes with electromagnetic signals from an antenna inside the mobile phone, and thus reduces communication performance of the antenna inside the mobile phone. In present technology, the metal support, used to stabilize the electronic component inside the mobile phone, reduces user experience.

BRIEF DESCRIPTION OF THE DRAWINGS

In order to more clearly illustrate the embodiments of the present disclosure or related art, the following figures described in the embodiments are briefly introduced. It is obvious that the drawings are merely some embodiments of the present disclosure, a person skilled in the art can obtain other figures according to these figures without paying the premise.

DETAILED DESCRIPTION OF ILLUSTRATED EMBODIMENTS

In combination with the drawings of the embodiments of the present disclosure, the following is related to a detailed and complete description of the technology of the embodiments of the present disclosure.

Figure 1:
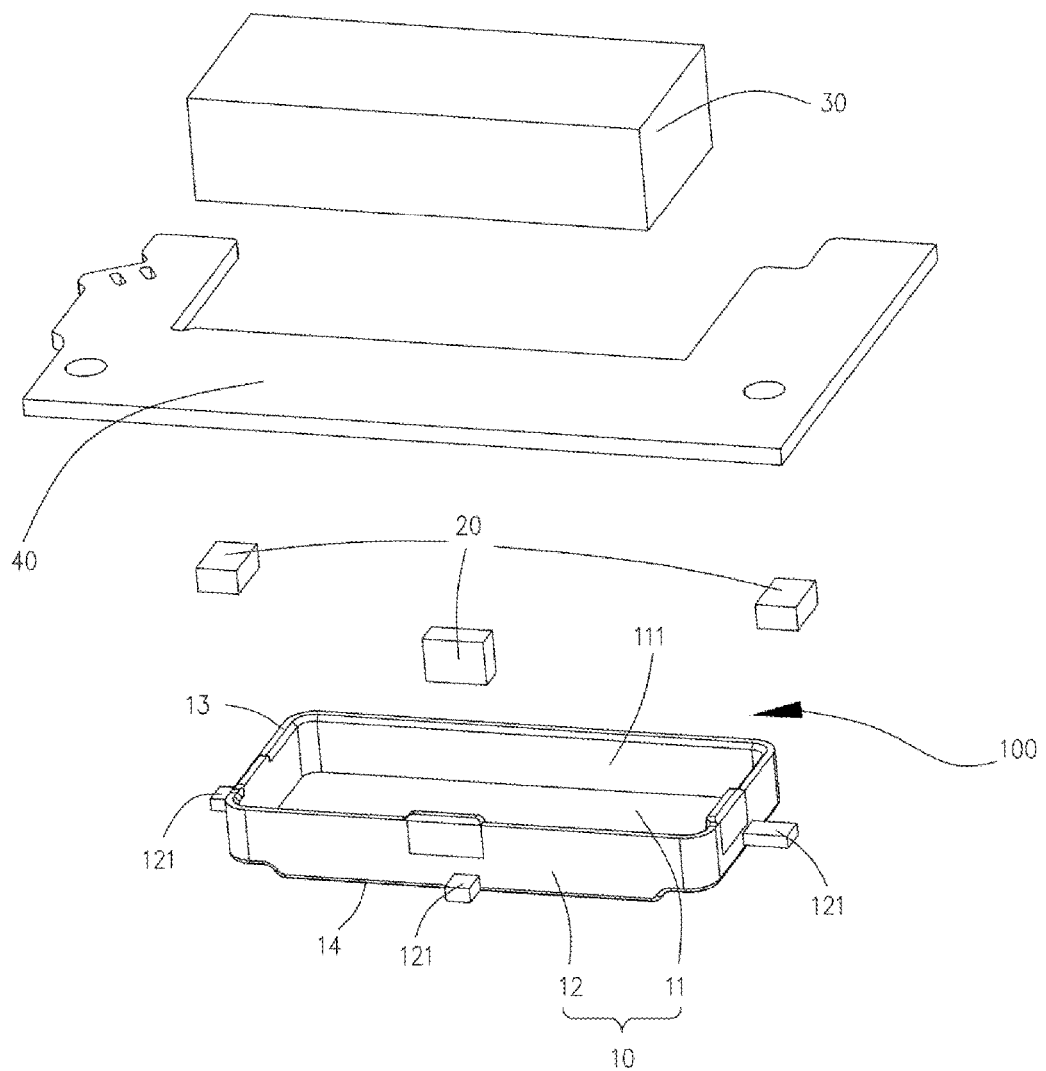
FIG. 1 is an exploded view of a bracket assembly according to an embodiment of the present disclosure.
Figure 2:
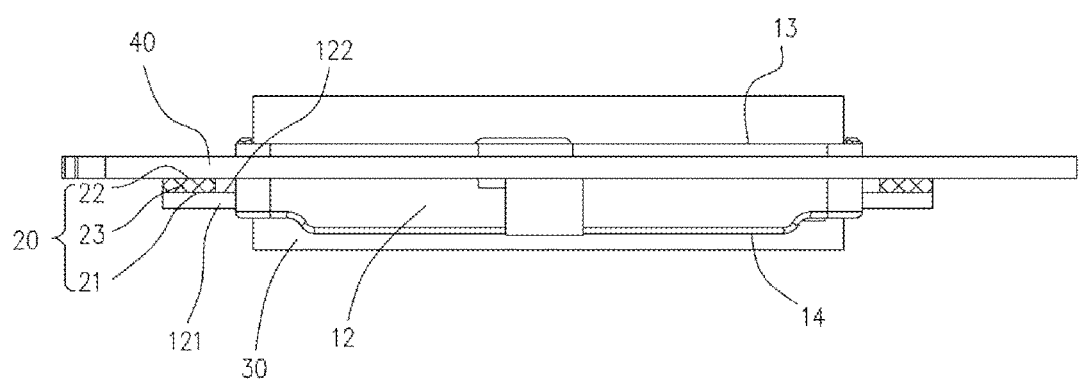
FIG. 2 is an assembled view of the bracket assembly illustrated in FIG. 1.
Figure 3:
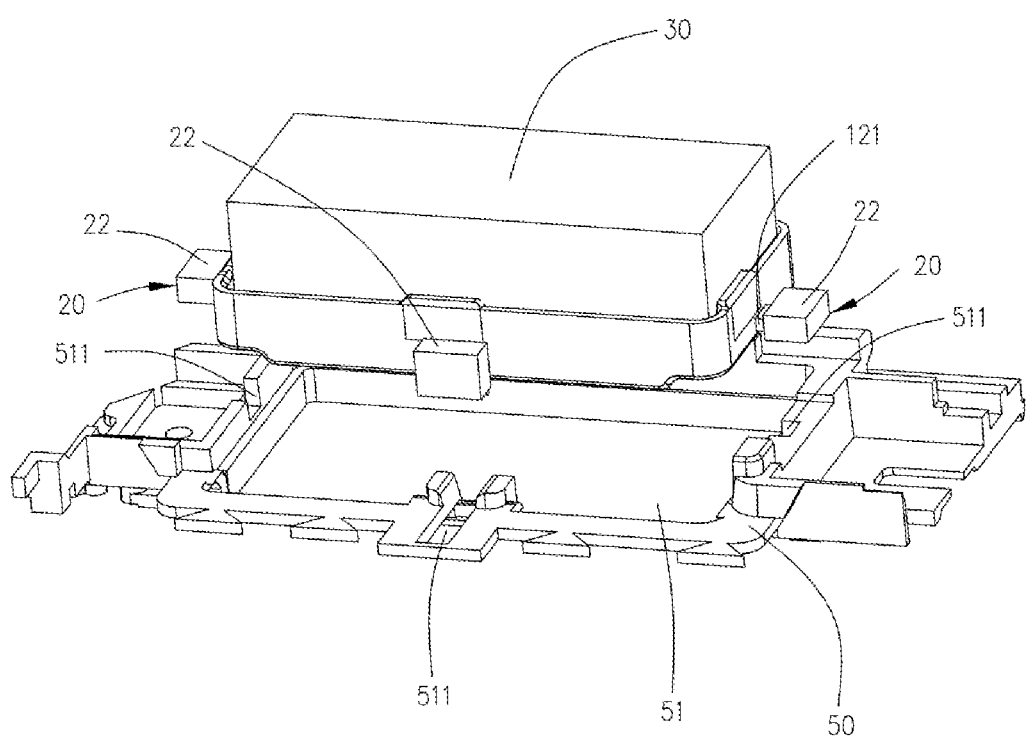
FIG. 3 is an exploded view of the bracket assembly and a frame illustrated in FIG. 1.

Referring to FIGS. 1, 2, and 3, an embodiment of the present disclosure provides a bracket assembly 100 configured to fix an electronic component 30 and conduct a ground electrode 40. The bracket assembly 100 includes a metal support 10 and a plurality of conductive members 20. The metal support 10 includes a mounting part 11 and a carrier part 12 surrounding a peripheral edge of the mounting part 12. The mounting part 11 is configured to fix the electronic component 30, and the carrier part 12 includes a plurality of ground parts 121 arranged circumferentially about the mounting part 12 at intervals. Each of the conductive members 20 is fixedly connected to a corresponding one of the ground parts 121, and configured to conduct current to a corresponding one of the ground parts 121 and the ground electrode 40. It is to be understood that bracket assembly 100 is applied to a mobile terminal. The mobile terminal may be an electronic equipment such as a mobile phone, a notebook computer, and a tablet computer, etc. The electric component 30 is secured to the metal support 10 of the bracket assembly 100 to facilitate installation of the electric component 30. The electric component 30 may be a camera module, a speaker, a fingerprint module, and a connector, etc.

The bracket assembly 100 includes the metal support 10 and the conductive members 20, and the electronic component 30 is fixed to the mounting part 11 of the metal support 10 so as to satisfy stable installation requirements of the electric component 30. The carrier part 12 of the metal support 10 is disposed surrounding the mounting part 11 and includes the ground parts 121 arranged at intervals, and each of the conductive members 20 is configured to ground a corresponding one of the ground parts 121, such that the entire metal support 10 is grounded at multiple points. Therefore, the overall electric potential of the metal support 10 is reduced to improve interference with electromagnetic signals from an antenna and thus increase user experience.

In the embodiment, the metal support 10 has a rectangular block shape. The metal support 10 may be made of aluminum alloy material, silver material, or iron material, etc. The metal support 10 is formed by shaping a metal block using an automatic numerical control milling process. That is, forming dimensions of the mounting part 11 and the carrier part 12 are machined by the numerical control milling process such that dimensional accuracies of the mounting part 11 and the carrier part 12 are high, the electronic component 30 can be effectively stabilized and precisely positioned by the mounting part 11, and the position of the electronic component 30 can be easily calibrated. In addition, the carrier part 12 can be effectively fixed to an external member such that the fixing position of the metal support 10 is precise and the metal support 10 is conveniently positioned. Therefore, the mounting position of the electronic component 30 can be accurately improved and performance of the electronic component 30 can be improved. The mounting part 11 can fix one electronic component 30, two electronic components 30, or a plurality of electronic components 30 such that the metal support 10 can fix the plurality of electronic components centrally to save space. The carrier part 12 surrounds the peripheral edge of the mounting part 11 such that the carrier part 12 surrounds a peripheral edge of the electronic component 30. Similarly, the carrier part 12 may surround the peripheral edge of one electronic component 30, peripheral edges of two electronic components 30, or peripheral edges of a plurality of electronic components 30 such that the carrier part 12 can protect the electronic components 30, such as from electrostatic protection, and reduce electromagnetic interference to the electronic component 30. The ground parts 121 may be arranged around the carrier part 12 or may be arranged on three side walls of the carrier part 12. Each of the ground parts 121 abuts against the conductive member 20 such that the ground part 121 is electrically connected to the conductive member 20 and electrically connected to the ground electrode 40 via the conductive member 20. There is a gap between the two adjacent ground parts 121 such that the ground parts 121 can be largely grounded to the carrier part 12. It is to be understood that, in other embodiments, the carrier part 12 does not surround the peripheral edge of the electronic component 30.

In the embodiment, the conductive member 20 connects current of the metal support 10 to the ground electrode 40. Each of the conductive members 20 may be electrically connected to the ground electrode 40 independently. The conductive members 20 may be integrally disposed on the ground parts 121 and collectively electrically connected to the ground electrode 40. The conductive member 20 may, on one hand, reduce the overall electric potential of the metal support 10 and, on the other hand, static electricity of the metal support 10 is guided to the ground electrode 40 so as to prevent the static electricity of the metal support 10 from flowing to the electronic component 30, to protect the electronic component 30. The ground electrode 40 may be exposed copper on a board, and each of the conductive members 20 abuts against the exposed copper on the board.

Further, the conductive member 20 is conductive foam and includes a first contact part 21, a second contact part 22 opposite the first contact part 21, and an elastic part 23 elastically disposed between the first contact part 21 and the second contact part 22, and the elastic part 23 is configured to apply a restoring force to the first contact part 21 and the second contact part 22 such that the first contact part 21 and the second contact part 22 firmly abut against the ground part 121 and the ground electrode 40, respectively.

In an embodiment, the conductive member 20 is a rectangular sheet-shaped conductive foam. The first contact part 21 and the second contact part 22 are two opposite surfaces of the conductive foam, respectively. The elastic part 23 is an interlayer between the two surfaces of the conductive foam. The conductive member 20 is attached to the ground part 121, that is, the first contact part 21 is attached to the ground part 121. The metal support 10 and the conductive members 20 are collectively mounted on the board or a common electrode so that the ground electrode 40 is attached to the second contact part 22 of the conductive member 20. The ground electrode 40 presses the second contact part 22 so that the elastic part 23 is compressed and generates an elastic restoring stress, and the elastic part 23 returns to a stretch state and provides an elastic restoring force to the first contact part 21 and the second contact part 22. Therefore, the first contact part 21 and the second contact part 22 firmly abut against the ground part 121 and the ground electrode 40, respectively, with the elastic restoring force.

The presence of air bubbles between the first contact part 21 and the ground part 121 can be avoided and loose contact between the first contact part 21 and the ground part 121 can be avoided to improve conduction performance between the first contact part 21 and the ground part 121. The presence of air bubbles between the second contact part 22 and the ground electrode 40 can be avoided and loose contact between the second contact part 22 and the ground electrode 40 can be avoided to improve conduction performance between the second contact part 22 and the ground electrode 40. The ground part 121 has a stable electrical connection with the ground electrode 40 via the conductive member 20 so that the ground parts 121 are equally grounded to reduce interference to the antenna from the bracket assembly 100.

In detail, the first contact part 21 completely covers the ground part 121, thereby increasing a contact area with the ground part 121 and reducing damage to the ground part 121. The conductive member 20 is cushioned to the ground part 121 when vibration occurs in the metal support 10, thereby absorbing the vibration of the metal support 10 and preventing the electronic component 30 from shaking to ensure safety of the electronic component 30. The second contact part 22 completely covers the ground electrode 40, thereby reducing damage to the ground part 121 and preventing ground failure of the metal support 10 to ensure ground safety of the metal support 10. It is understood that, in other embodiments, the conductive member 20 may also have a metal spring with an elastic pin.

Further, the carrier part 12 is a peripheral wall of the metal support 10, the ground part 121 is a boss disposed on the carrier part 12. The carrier part 12 includes a geometric center axis, the ground part 121 includes a contact surface 122 perpendicular to the geometric center axis of the carrier part 12, and the first contact part 21 abuts against the contact surface 122.

In the embodiment, the metal support 10 includes a top surface 13 and a bottom surface 14 opposite the top surface 13. The carrier part 12 is disposed between the top surface 13 and the bottom surface 14. The frame of a mobile phone such as a middle frame of the mobile phone is fixed to the bottom surface 14 or a metal cover of the mobile phone is fixed to the top surface 13. The geometric central axis of the carrier part 12 is perpendicular to the top surface 13 and the bottom surface 14. The ground part 121 is a rectangular boss. The carrier part 12 includes a contact surface 122. The contact surface 122 is disposed on a side of the ground contact part 121 near the top surface 13. The ground electrode 40 can press the conductive member 20 with its own gravity, thereby making the bracket assembly 100 simple in structure.

The contact surface 122 is parallel to the bottom surface 14 so that a support force direction of the metal support 10 is parallel to a resistance force direction of the ground part 121, that is, the support force of the metal support 10 and the resistance force of the ground part 121 are offset against each other so as to avoid the problem that the metal support 10 is unevenly stressed and displacement of the metal support 10 occurs. Normal operation of the electronic component 30 is ensured. It is understood that, in other embodiments, the contact surface 122 may also be disposed on a side of the ground part 121 near the bottom surface 14. The ground part 121 may also be a recess disposed in the carrier part 12.

Further, the conductive member 20 completely covers the ground part 121.

In the embodiment, the bracket assembly 100 is applied to the mobile terminal and the ground part 121 may be fixed to a frame 50 of the mobile terminal such as a middle frame of the mobile terminal. In detail, the frame 50 includes a recess 51, and the bottom surface 14 of the metal support 10 is attached to the bottom surface of the recess 51. The carrier part 12 engages with a peripheral side wall of the recess 51. The peripheral side wall of the recess 51 includes a groove 511. The ground part 121 and the conductive member 20 are cooperatively engaged with the groove 511, and the second contact part 22 exposes the groove 511. Two side walls of the groove 511 press the conductive member 20 so that the ground part 121 and the groove 511 are securely fixed, thereby making installation of the metal bracket 10 reliable.

The ground parts 121 are disposed on the peripheral edge of the metal support 10 so that the metal support 10 can be stably grounded, interference to the antenna is reduced. The ground parts 121 are engaged with the grooves 511 so that the metal support 10 are positioned and mounted accurately, and the bracket assembly 100 has stable structure so that the electronic component 30 is reliable. In other embodiments, the ground part 121 includes a positioning surface on both sides of the contact surface 121. The positioning surface is attached to the side wall of the groove 511 to locate the ground part 121.

Further, the mounting part 11 is a hole part and includes an inner wall and an opening, the electronic component 30 includes a peripheral side wall, the carrier part 12 includes the geometric center axis, the inner wall of the mounting part 11 is attached to the peripheral side wall of the electric component 30, and a direction of the opening of the mounting part 11 is parallel to the geometric center axis of the carrier part 12.

In the embodiment, the mounting part 11 is a rectangular hole part. The mounting part 11 extends through the top surface 13 to the bottom surface 14. The mounting part 11 includes an inner side wall 111. The inner side wall 111 is parallel to the carrier part 12. The inner side wall 111 is firmly attached to the peripheral side wall of the electronic component 30 so that the mounting part 11 is securely mounted to the electronic component 30 and the inner side wall 111 is machined to a precise size so as to satisfy precise installation requirements of the electronic component 30. The bracket assembly 100 is applied to the mobile terminal, both ends of the electric component 30 pass through the mounting part 11. One end of the electric component 30 near the top surface 13 may be directed towards outside of the mobile terminal, and one end of the electric component 30 near the bottom surface 14 may be electrically connected to the board of the mobile terminal via a flexible circuit board, thereby ensuring that the electronic component 30 is mounted in an accurate position and enables the electric component 30 to operate stably, thereby improving the user experience. The geometric center axis of the carrier part 12 is parallel to the direction of the opening of the mounting part 11 so as to facilitate mounting of the electric component 30 to the mounting part 12 and the stress of the electric component 30 to the metal support 10 is reduced. The ground parts 121 are disposed in the carrier part 12 so as to be remote from the mounting part 11 to avoid damage to the mounting part 11 so that the mounting part 11 can effectively secure the electric component 30. Since the mounting part 11 is a hole part passing through the top surface 13 and the bottom surface 14 so that the metal support 10 forms a floating frame. When the metal support 10 receives current or is subjected to electromagnetic induction to generate current, the carrier part 12 is surrounded by a coil, so that a hollow area of the mounting part 11 is liable to generate electromagnetic signals. The ground parts 121 are arranged in a circumferential direction of the mounting part 11, and the ground parts 121 cause circumference of the metal support 10 to be equally grounded so as to prevent current from reflowing to the carrier part 11 and prevent the metal support 10 from generating electromagnetic signals in the hollow area of the mounting part 11, thereby reducing interference of the bracket assembly 100 to the communication of the mobile terminal. It is to be understood that, in other embodiments, the mounting part 11 may also be a recess from the top surface 13 toward the bottom surface 14.

Figure 4:
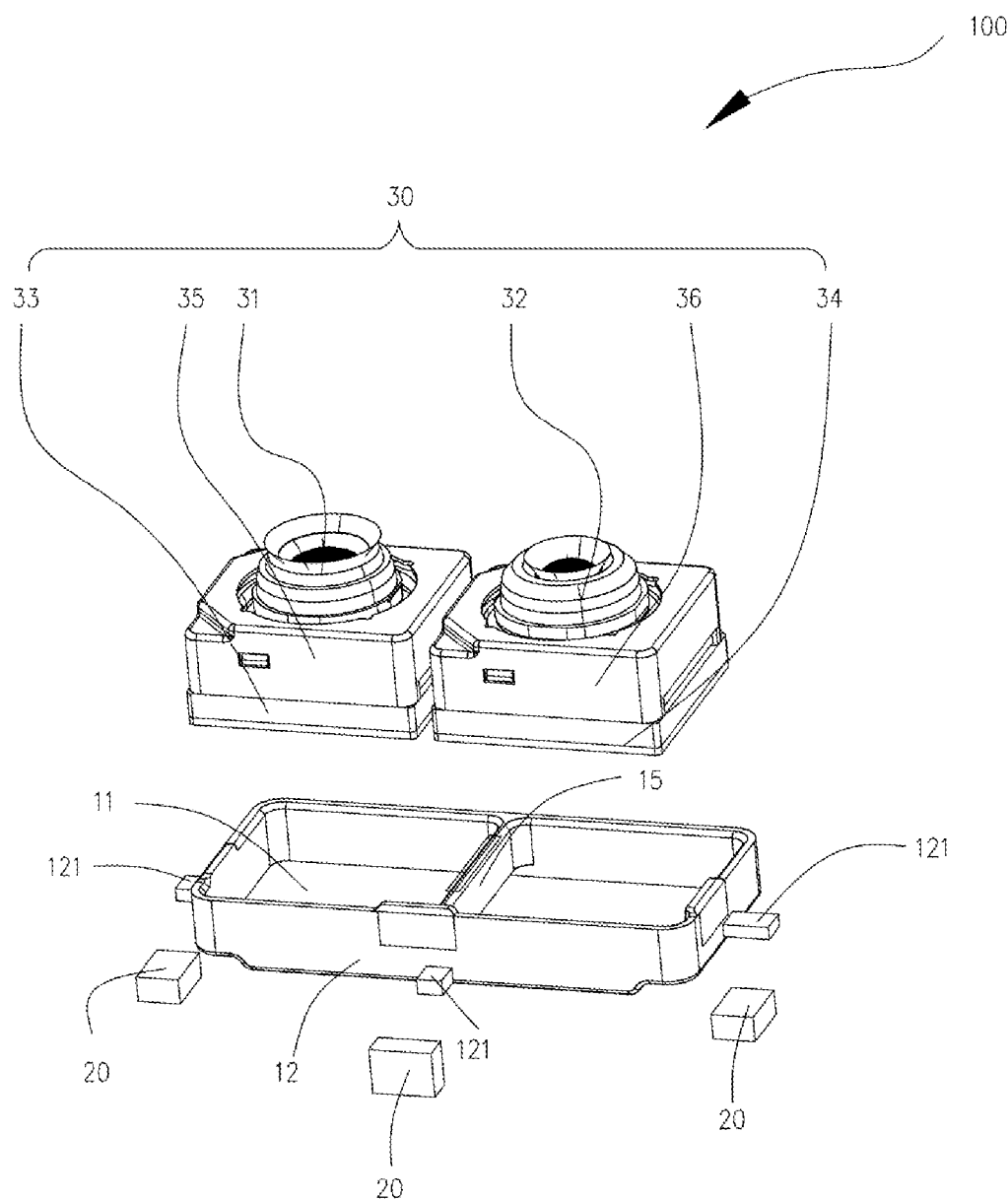
FIG. 4 is an exploded view of a functional component according to the embodiment of the present disclosure.
Figure 5:
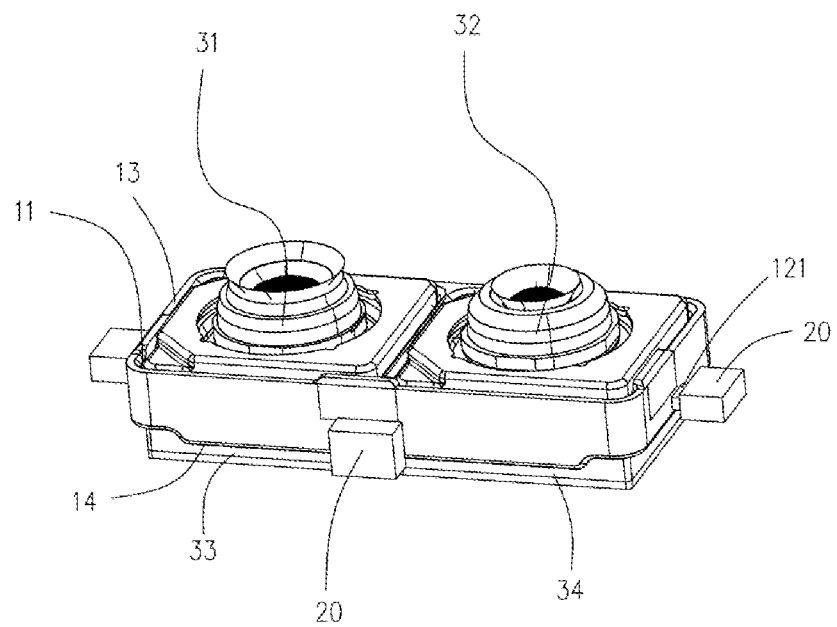
FIG. 5 is an assembled view of the functional component illustrated in FIG. 4.

Referring to FIGS. 4 and 5, an embodiment of the present discourse also provides a functional component 200. The functional component 200 includes the bracket assembly 100 (see FIG. 1), the functional component 200 further includes the electric component 30 fixed to the mounting part 11. The electric component 30 is firmly fixed to the mounting part 11 so that the electric component 30 can be fixed to the frame 50 of the mobile terminal (see FIG. 3). It is only necessary to disassemble the metal support 10 and the frame 50 when maintenance of the electric component 30 is required, so that the functional component 200 is easily mounted and easily disassembled, and the functional component 200 can be adapted to a variety of mobile terminals. In an embodiment, the electric component 30 is a dual camera assembly. The electric component 30 includes a first image lens 31 and a second image lens 32 arranged side by side with the first image lens 31. The first image lens 31 and the second image lens 32 are cooperatively assembled in the mounting part 11. In detail, an image optical axis of the first image lens 31 and an image optical axis of the second image lens 32 are parallel to the geometric center axis of the carrier part 12, so that the first image lens 31 and the second image lens 32 are calibrated in a plane perpendicular to the geometric center axis of the carrier part 12. The first image lens 31 and the second image lens 32 can be cooperatively operated to improve picture taking performance. The electric component 30 further includes a first base 33 and a second base 34 disposed side by side with the first base 33. The first base 33 drives the first image lens 31 to slide, and the second base 34 drives the second image lens 32 to slide. The first image lens 31 and the second image lens 32 pass through one end of the mounting part 11, and the first base 33 and the second base 34 pass through another end of the mounting part 11. The top surface 13 does not interfere with the first image lens 31 and the second image lens 32 to facilitate picture taking of the first image lens 31 and the second image lens 32. The first base 33 and the second base 34 are easily connected to the board so as to facilitate driving the first image lens 31 and the second image lens 32 to slide. The metal support 10 may only need to be attached to the peripheral side of the electric component 30 to effectively reduce volume of the metal support 10, to reduce production cost of the functional component 200, and to effectively reduce space taken up by the functional component 200.

Further, the electronic component 30 includes a first metal casing 35 covering the first camera lens 31 and a second metal casing 36 covering a second camera lens 32, and the first metal casing 35 and the second metal casing 36 are fixed to the mounting part 11.

In the embodiment, the first metal casing 35 covers the first base 33, and the first image lens 31 passes through the first metal casing 35. The second metal casing 36 covers the second base 34, and the second image lens 32 passes through the second metal casing 36. The first metal casing 35 and the second metal casing 36 protect the first base 33 and the second base 34, respectively to avoid damage to the first base 33 and the second base 34. Dimensional accuracy of the first metal casing 35 and the second metal casing 36 can be improved utilizing metal properties of the first metal casing 35 and the second metal casing 36. The first metal casing 35 and the second metal casing 36 are fixed on the mounting part 11, and the first camera lens 31 and the second camera lens 32 are positioned precisely on the metal support 10, so that simultaneous picture taking performance of the first image lens 31 and the second image lens 32 is improved and performance of the electric component 30 is improved. In detail, the functional component 200 includes an adhesive disposed between the mounting part 11 and the first metal casing 35 and between the mounting part 11 and the second metal casing 36 so that the first metal casing 35, the second metal casing 36, and the metal bracket 10 are structurally stable. Since the first metal casing 35 and the second metal casing 36 are made of metal material, the first metal casing 35 and the second metal casing 36 are easily subject to static electricity. The first metal casing 35 and the second metal casing 36 are partially electrically connected to the metal support 10, and the first metal casing 35 and the second metal casing 36 are electrically connected to the ground electrode 40 through the metal support 10, so that electrical properties of the first metal casing 35, the second metal casing 36, and the metal support 10 are the same and thus preventing the first metal casing 35 and the second metal casing 36 from receiving static electricity to cause damage to the electric component 30 and effectively reducing interference with electromagnetic signals from the antenna caused by the first metal casing 35 and the second metal casing 36. It is understood that, in other embodiments, the functional component 200 includes an electrical conductor. The first metal casing 35, the second metal casing 36, and the metal support 10 may be electrically connected to the electrical conductor to improve safety of the functional component 200.

Further, the mounting part 11 includes a partition plate 15 configured to separate the first metal casing 35 and the second metal casing 36.

In the embodiment, the partition plate 15 separates the mounting part 11 from two through holes, and the first metal casing 35 and the second metal casing 36 are fixed in the two through holes, respectively so that the first image lens 31 and the second image lens 32 are separately calibrated, that is, after positioning the first camera lens 31, the second image lens 32 is calibrated and positioned using the first image lens 31 as a reference so as to improve positioning accuracy of the first image lens 31 and the second image lens 32. The partition plate 15 exerts a force on the first metal casing 35 and the second metal casing 36 to improve stability of the electric component 30. The electrical conductor electrically connected to the first metal casing 35 and the second metal casing 36 is disposed on the partition plate 15 to facilitate the conduction of the electric component 30 and the metal support 10. Electrostatic protection performance of the electric component 30 is improved, and safety of the functional component 200 is improved. It is understood that, in other embodiments, the first metal casing 35 and the second metal casing 36 may be integrally formed so that the electric component 30 has simple structure.

Figure 6:
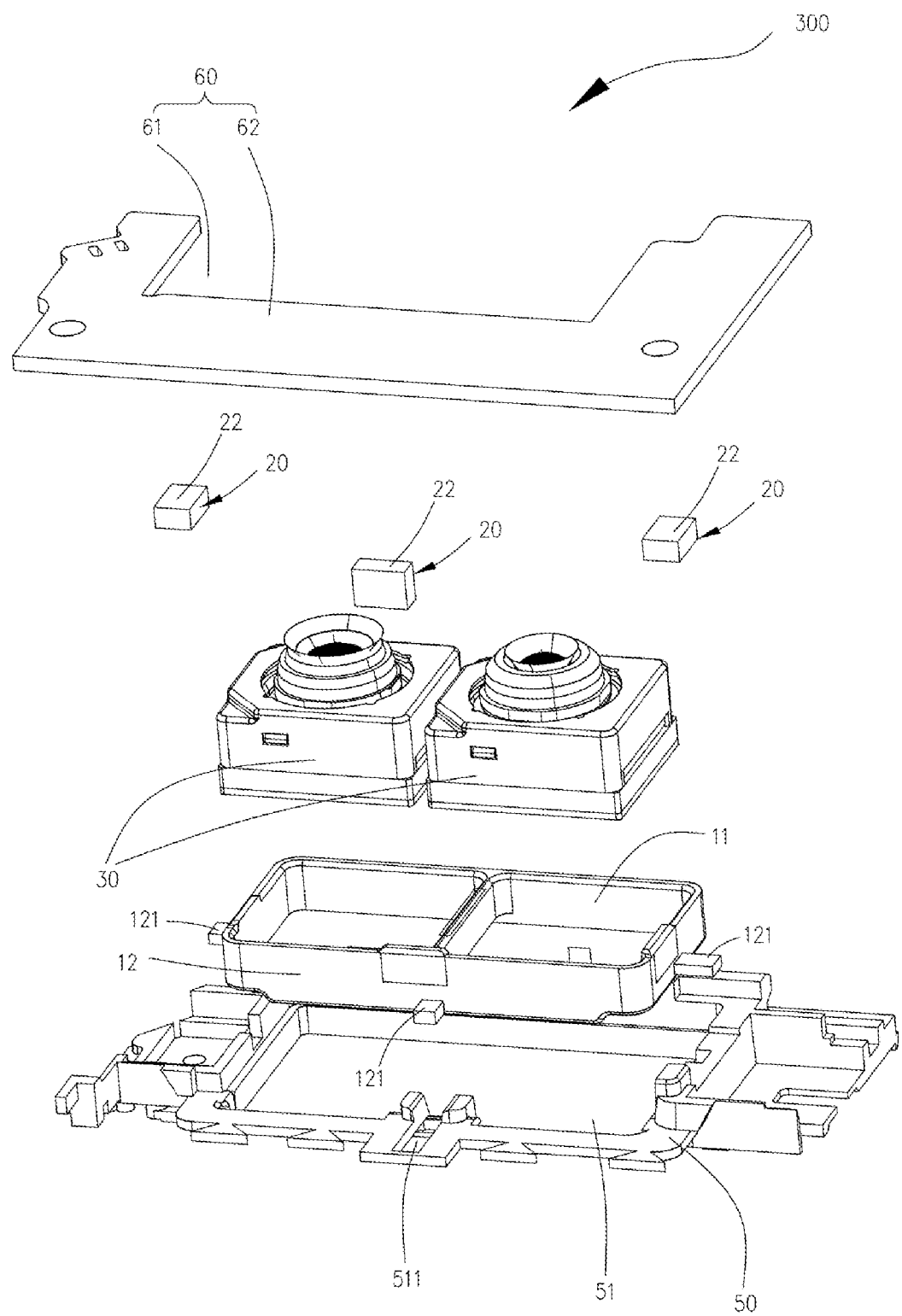
FIG. 6 is a partially exploded view of a mobile terminal according to the embodiment of the present disclosure.
Figure 7:
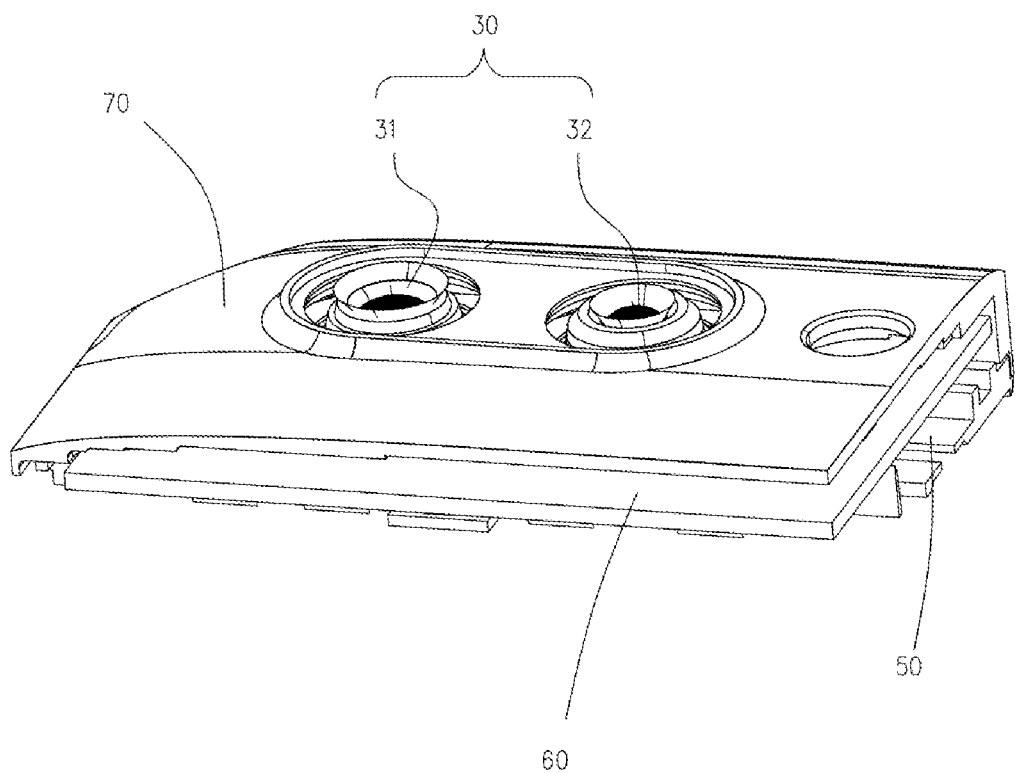
FIG. 7 is a partially exploded view of the mobile terminal illustrated in FIG. 6.

Referring to FIGS. 6 and 7, an embodiment of the present disclosure also provides a mobile terminal 300. The mobile terminal 300 includes the functional component 200, the frame 50, and a board 60. The board 60 is fixed to the frame 50. The board 60 includes a mounting area 61 and a ground area 62 surrounding the mounting area 61. The ground electrode 40 is disposed in the ground area 62. The metal support 10 is fixed in the mounting area 61. The second contact part 22 abuts against the ground area 62 and electrically connects the ground electrode 40. In detail, the mounting area 61 includes a through hole corresponding to the recess 51 of the frame 50. The metal support 10 passes through the through hole of the mounting area 61. Exposed copper is disposed in the ground area 62, and the ground electrode 40 is disposed on exposed copper in the ground area 62. The ground electrode 40 is disposed on one side of the board 60. A plurality of the conductive members 20 are attached to one side of the board 60 so that the second contact part 22 of the conductive member 20 abuts against the ground area 62 so that the second contact part 22 is electrically connected to the ground electrode 40.

The mobile terminal 300 also includes a rear cover 70 attached to the frame 50, and the board 60 is fixed between the rear cover 70 and the frame 50. The rear cover 70 is a metal plate. The rear cover 70 covers the functional component 200 to protect the functional component 200 and improve appearance performance of the mobile terminal 300. The rear cover 70 includes two picture taking windows, and the first image lens 31 and the second image lens 32 take picture through the two picture taking windows, respectively, so that the electric component 30 is normally operated.

The bracket assembly, the functional component, and the mobile terminal of the embodiments of the present disclosure includes the metal support and the conductive members, and the electronic component is fixed to the mounting part of the metal support so as to satisfy stable installation requirements of the electric component. The carrier part of the metal support is disposed surrounding the mounting part and includes the ground parts arranged at intervals, and each of the conductive members is configured to conduct and ground a corresponding one of the ground parts, such that the entire metal support is grounded at multiple points. Therefore, the overall electric potential of the metal support is reduced to improve interference with electromagnetic signals from the antenna and thus increase user experience.

The foregoing descriptions are merely exemplary embodiments of the present disclosure. Various modifications and alterations may be made to the present disclosure for a person skilled in the art. Any modification, equivalent substitution, improvement or the like made within the spirit and principle of the present disclosure shall fall into the protection scope of the present disclosure.

What is claimed is:
1. A bracket assembly for a mobile device, comprising:
a metal support comprising a mounting part and a carrier part surrounding the mounting part, the mounting part configured to fix an electronic component of the mobile device, the carrier part comprising a plurality of ground parts protruding outwardly from three side walls of the carrier part and parallel to the mounting part; the plurality of ground parts arranged circumferentially about the mounting part at intervals; and
a ground electrode being substantially U-shaped;
a plurality of conductive members, each of the conductive members being connected to a corresponding one of the ground parts and configured to conduct a corresponding one of the ground parts and the ground electrode;
wherein the ground electrode is an exposed copper on a board and each of the plurality of conductive members abuts against the exposed copper on the board;
wherein each of the plurality of conductive members completely encloses a corresponding one of the plurality of ground parts;
wherein the ground electrode is attached to each of the plurality of conductive members, and each of the ground parts and the plurality of conductive members are arranged on only the three side walls of the carrier part;
wherein each of the ground parts comprises a contact surface parallel to a bottom surface of the metal support, each of the conductive members abuts against a corresponding one of the contact surfaces, and a support force direction of the metal support is parallel to a resistance force direction of the ground parts; and wherein the electronic component is a dual camera assembly, the electronic component comprises a first camera lens and a second camera lens arranged side by side with the first camera lens, and the first camera lens and the second camera lens are disposed on the mounting part.

2. The bracket assembly as claimed in claim 1, wherein the conductive member is conductive foam and comprises a first contact part, a second contact part opposite the first contact part, and an elastic part elastically disposed between the first contact part and the second contact part, and the elastic part is configured to apply a restoring force to the first contact part and the second contact part such that the first contact part and the second contact part abut against the ground part and the ground electrode, respectively.

3. The bracket assembly as claimed in claim 2, wherein the carrier part is a peripheral wall of the metal support, the ground part is a boss disposed on the carrier part, the carrier part comprises a geometric center axis, the ground part comprises a contact surface perpendicular to the geometric center axis of the carrier part, and the first contact part abuts against the contact surface.

4. The bracket assembly as claimed in claim 1, wherein the mounting part is a hole part and comprises an inner wall and an opening, the electronic component comprises a peripheral side wall, the carrier part comprises a geometric center axis, the inner wall of the mounting part is attached to the peripheral side wall of the electric component, and a direction of the opening of the mounting part is parallel to the geometric center axis of the carrier part.

5. A functional component configured to be used in a mobile device and conduct a ground electrode of the mobile device, comprising:
   an electronic component;
   a metal support comprising a mounting part and a carrier part surrounding the mounting part, the mounting part configured to fix the electronic component, the carrier part comprising a plurality of ground parts protruding outwardly from three side walls of the carrier part and parallel to the mounting part; the plurality of ground parts arranged circumferentially about the mounting part at intervals; and
   the ground electrode being substantially U-shaped;
   a plurality of conductive members, each of the conductive members being connected to a corresponding one of the ground parts and configured to conduct a corresponding one of the ground parts and the ground electrode;
   wherein the ground electrode is an exposed copper on a board and each of the plurality of conductive members abuts against the exposed copper on the board;
   wherein each of the plurality of conductive members completely encloses a corresponding one of the plurality of ground parts;
   wherein the around electrode is attached to each of the plurality of conductive members, and each of the around parts and the plurality of conductive members are arranged on only the three side walls of the carrier part;
wherein each of the ground parts comprises a contact surface parallel to a bottom surface of the metal support, each of the conductive members abuts against a corresponding one of the contact surfaces, and a support force direction of the metal support is parallel to a resistance force direction of the ground parts: and
wherein the electronic component is a dual camera assembly, the electronic component comprises a first camera lens and a second camera lens arranged side by side with the first camera lens, and the first camera lens and the second camera lens are disposed on the mounting part.

6. The functional component as claimed in claim 5, wherein the electronic component comprises a first metal casing covering the first camera lens and a second metal casing covering a second camera lens, and the first metal casing and the second metal casing are fixed to the mounting part.

7. The functional component as claimed in claim 6, wherein the mounting part comprises a partition plate configured to separate the first metal casing and the second metal casing.

8. The functional component as claimed in claim 5, wherein the electric component comprises a first base and a second base disposed side by side with the first base, the first image lens and the second image lens pass through one end of the mounting part, and the first base and the second base pass through another end of the mounting part.

9. The functional component as claimed in claim 5, wherein the conductive member is conductive foam and comprises a first contact part, a second contact part opposite the first contact part, and an elastic part elastically disposed between the first contact part and the second contact part, and the elastic part is configured to apply a restoring force to the first contact part and the second contact part such that the first contact part and the second contact part abut against the ground part and the ground electrode, respectively.

10. The functional component as claimed in claim 9, wherein the carrier part is a peripheral wall of the metal support, the ground part is a boss disposed on the carrier part, the carrier part comprises a geometric center axis, the ground part comprises a contact surface perpendicular to the geometric center axis of the carrier part, and the first contact part abuts against the contact surface.

11. The functional component as claimed in claim 5, wherein the mounting part is a hole part and comprises an inner wall and an opening, the electronic component comprises a peripheral side wall, the carrier part comprises a geometric center axis, the inner wall of the mounting part is attached to the peripheral side wall of the electric component, and a direction of the opening of the mounting part is parallel to the geometric center axis of the carrier part.

12. A mobile terminal, comprising:
   a board comprising a mounting area and a ground area surrounding the mounting area;
   an electronic component;
   a metal support fixed in the mounting area and comprising a mounting part and a carrier part surrounding the mounting part, the mounting part configured to fix the electronic component, the carrier part comprising a plurality of ground parts protruding outwardly from three side walls of the carrier part and parallel to the mounting part; the plurality of ground parts arranged circumferentially about the mounting part at intervals;
   a ground electrode disposed in the ground area and being substantially U-shaped; and
   a plurality of conductive members, each of the conductive members being connected to a corresponding one of the ground parts and configured to conduct a corresponding one of the ground parts and the ground electrode;
   wherein the ground electrode is an exposed copper on the board and each of the plurality of conductive members abuts against the exposed copper on the board;
   wherein each of the plurality of conductive members completely encloses a corresponding one of the plurality of ground parts;

wherein the ground electrode is attached to each of the plurality of conductive members, and each of the ground parts and the plurality of conductive members are arranged on only the three side walls of the carrier part;

wherein each of the ground parts comprises a contact surface parallel to a bottom surface of the metal support, each of the conductive members abuts against a corresponding one of the contact surfaces, and a support force direction of the metal support is parallel to a resistance force direction of the ground parts; and wherein the electronic component is a dual camera assembly, the electronic component comprises a first camera lens and a second camera lens arranged side by side with the first camera lens, and the first camera lens and the second camera lens are disposed on the mounting part.

13. The mobile terminal as claimed in claim 12, wherein the electronic component comprises a first metal casing covering the first camera lens and a second metal casing covering a second camera lens, and the first metal casing and the second metal casing are fixed to the mounting part.

14. The mobile terminal as claimed in claim 13, wherein the mounting part comprises a partition plate configured to separate the first metal casing and the second metal casing.

15. The mobile terminal as claimed in claim 12, wherein the conductive member is conductive foam and comprises a first contact part, a second contact part opposite the first contact part, and an elastic part elastically disposed between the first contact part and the second contact part, and the elastic part is configured to apply a restoring force to the first contact part and the second contact part such that the first contact part and the second contact part abut against the ground part and the ground electrode, respectively.

16. The mobile terminal as claimed in claim 15, wherein the carrier part is a peripheral wall of the metal support, the ground part is a boss disposed on the carrier part, the carrier part comprises a geometric center axis, the ground part comprises a contact surface perpendicular to the geometric center axis of the carrier part, and the first contact part abuts against the contact surface.

17. The mobile terminal as claimed in claim 12, wherein the mounting part is a hole part and comprises an inner wall and an opening, the electronic component comprises a peripheral side wall, the carrier part comprises a geometric center axis, the inner wall of the mounting part is attached to the peripheral side wall of the electric component, and a direction of the opening of the mounting part is parallel to the geometric center axis of the carrier part.

* * * * *